United States Patent [19]
Bahr et al.

[11] Patent Number: 4,488,043
[45] Date of Patent: Dec. 11, 1984

[54] TOMOGRAPHIC MARKING DEVICE

[75] Inventors: Gunter F. Bahr, Washington, D.C.; Barry E. Schell, Silver Spring, Md.

[73] Assignee: The United States of America as represented by the Secretary of the Army, Washington, D.C.

[21] Appl. No.: 411,116

[22] Filed: Aug. 24, 1982

[51] Int. Cl.³ .......................................... G01N 23/00
[52] U.S. Cl. ............................... 250/311; 250/491.1
[58] Field of Search ............ 250/311, 306, 307, 491.1; 378/205, 206, 207

[56] References Cited
U.S. PATENT DOCUMENTS

| | | | |
|---|---|---|---|
| 1,404,171 | 1/1922 | Waite | 378/205 |
| 2,623,180 | 12/1952 | Zurli et al. | 378/206 |
| 3,702,399 | 11/1972 | Lucas | 250/442.1 |

OTHER PUBLICATIONS

"Instrumentation for the Three-Dimensional Reconstruction of Cellular Organelles by Electron Microscopy", Bahr et al., *Ultramicroscopy*, 6, pp. 251–258, Sep. 8, 1981.

*Primary Examiner*—Bruce C. Anderson
*Attorney, Agent, or Firm*—John H. Raubitschek; Arthur I. Spechler; Werten F. W. Bellamy

[57] ABSTRACT

A tomographic marking device is disposed in an electron microscope between a goniometer stage for holding a specimen and a fluorescent screen for displaying a magnified image of the specimen. The device comprises an externally geared, ring wheel, having a pair of spaced-apart, colinearly disposed pins fixed to the inner periphery of the wheel and defining a straight line parallel to both the screen and the tilt axis of rotation of the goniometer stage. Because the magnetic lenses of the microscope rotate the magnified image on the screen, means are provided to rotate the wheel and to indicate the position of angular rotation of the tilt axis of the goniometer stage located on the screen relative to the actual tilt axis of the goniometer stage.

8 Claims, 1 Drawing Figure

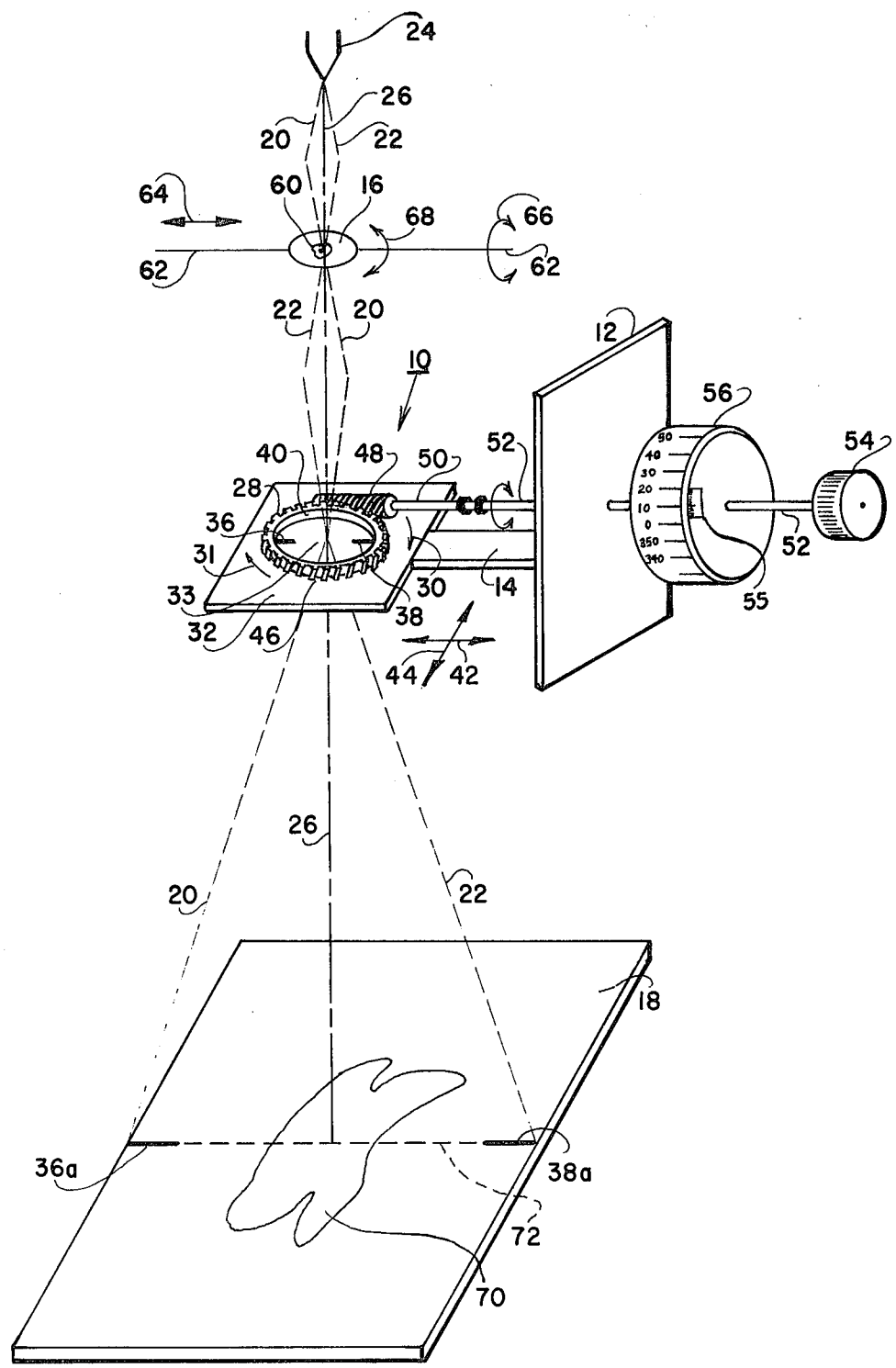

TOMOGRAPHIC MARKING DEVICE

The invention described herein may be manufactured, used and licensed by, or for, the Government for governmental purposes without the payment of any royalties thereon.

BACKGROUND OF THE INVENTION

This invention relates generally to a tomographic marking device. More particularly, though not exclusively, the invention relates to a tomographic marking device adapted for use in electron microscopes. The device indicates, through markers projected on the images screen of the microscope, or on a final photograph, the location of the tilt axis of a specimen goniometer stage. The device also indicates the angular rotation of the tilt axis of the specimen goniometer stage on the screen relative to the position of the actual tilt axis of the goniometer stage supporting the specimen. The angular (corkscrew) rotation of the image on the screen is caused by the magnetic lenses of the microscope.

The principal object of the novel tomographic marking device is to provide a visually recordable reference of the location of the electron microscope goniometer tilt axis relative to the image of the specimen being examined and tilted. This information is important and necessary to make accurate tomographic measurements and three-dimensional reconstructed images of the specimen.

Ideally, a tilt axis indicating device would be located within the specimen-holding goniometer stage. This arrangement, however, would require an indicating device of microscopic scale in size, and is, consequently, impractical, if not impossible. Also, locating a tilt axis indicating device within the camera system, below the viewing screen, of the electron microscope would not meet the necessary visibility and positioning requirements of such a device. These requirements are:

1. The tilt axis reference marks should be visible to the operator of the electron microscope.
2. The reference marks should be moveable because the magnified image rotates about the optical axis with changes in magnification, and
3. The device should be reliable to measurements on the order of 0.005 inch.

There are no known devices in the prior art that satisfy the above requirements.

SUMMARY OF THE INVENTION

The novel tomographic marking device of the present invention satisfies the aforementioned requirements. The novel device is adapted to cooperate with a tilt goniometer stage wherein a specimen to be examined is rotated about the tilt axis of the stage. The stage tilt axis is parallel to the viewing screen of the electron microscope, and is also moveable in the direction of the tilt axis. In one embodiment of the invention, the device comprises a ring wheel having at least one pin fixed to it that defines a line substantially parallel to the screen and passes through the optical axis of the microscope. The ring wheel is deposed between the stage and the screen so that a shadow of the pin projects onto the screen. Means are provided to rotate the wheel about the optical axis so as to align the image (or shadow) of the pin with the location of the tilt axis on the screen.

In another embodiment of the invention, a pair of spaced-apart, colinearly disposed pins are fixed to the wheel to define a line substantially parallel to the screen and passing through the optical axis. The means to rotate the wheel can also indicate the amount of rotation of the tilt axis located on the screen with respect to the actual tilt axis on the stage.

The novel features of this invention, as well as the invention itself, both as to its organization and operation will best be understood from the accompanying drawing, taken in conjunction with the accompanying description, and in which:

The single FIGURE is a plan, perspective view of the novel tomographic marking device disposed within an electron microscope, the microscope being shown schematically and with parts broken away for the sake of clarity.

DESCRIPTION OF THE PREFERRED EMBODIMENTS

Referring now to the drawing, the novel tomographic marking device 10 is shown disposed within an electron microscope and surrounded by a vacuum port plate 12. The device 10 is supported by a bracket 14, fixed to the plate 12 by any suitable means, and spaced from both a specimen-holding goniometer stage 16 and a fluorescent screen 18 of the microscope. The dashed lines 20 and 22 represent the electron rays emanating from a filament 24 of the microscope, and the dashed line 26 represents the optical axis of the microscope.

The device 10 comprises a geared ring wheel 28 mounted for rotation about the optical axis 26, and in the opposite directions indicated by the arrows 30 and 31. The wheel 28 is mounted for rotation on a support platform 32 by any suitable means as, for example, being disposed within a circular groove (not shown) in the platform 32, and the platform 32 is fixed to the bracket 14 by any suitable means. The platform 32 is formed with an opening 33 coincident with the central opening of the ring wheel 28. A pair of spaced-apart, colinearly disposed, micro-pointed, metal marker pins 36 and 38 are fixed to the inner surface 40 of the wheel 28 and aligned such that a line drawn between the points of the pins passes exactly through the center of the wheel 28. The center of the wheel 28 being open, permits the electrons of the microscope to pass through the opening 33 of the platform 32 to the screen 28 and to a photographic camera (below screen 18, not shown). The microscope user is thus able to view the normal magnified image on the screen 18 with the shadows 36a and 38a of the pins 36 and 38, respectively, superimposed.

The wheel 28 is disposed so that the image size of the shadows 36a and 38a is magnified a predetermined amount, say 5 times actual size. Also, the wheel 28 is not seen on the screen 18, only the shadows 36a and 38a being visible. Thus, photomicrographs taken with the electon microscope contain the normal magnified image of the specimen with the shadows 36a and 38a of the marker pins 36 and 38, respectively.

The wheel 28 is held in precise orthogonal position ralative to the optical axis 26 of the microscope by the platform 32. Although not shown, since it is not a part of the present invention, the bracket 14 is adjustable by set screws in the X and Y directions (arrows 42 and 44, respectively) to align the wheel 28 so that its center is on the optical axis 26.

Means are provided to rotate the wheel 28 about the optical axis 26. To this end, the outer periphery of the wheel 28 is formed with gear teeth 46 which are adapted to mesh with a worm gear 48. The worm gear 48 is fixed to a rod 50 which, is turn, is coupled to a rod 52 that penetrates the vacuum port plate 12 through an air-tight seal. A control knob 54 is fixed to the end of the rod 52 to rotate the worm gear 48 and the wheel 28. Azimuth positions of the marker pins 36 and 38 are read on a graduated cylindrical drum 56 fixed to the rod 52 between the plate 12 and the knob 54. The drum 56 may be coupled to a vernier attachment 55 to measure angles with a tolerance on the order of 0.005 inch.

Although the embodiment illustrated in the FIGURE shows two pins 36 and 38, it will be understood that the device 10 can be formed with only one of the pins 36 or 38. The pins 36 and 38 are made from a hard metal, such as tantalum or steel, for example.

A specimen 60 to be magnified by the electron microscope is disposed on the goniometer stage 16. The goniometer stage 16 is of the type that can be moved back and forth along its tilt axis 62 in the directions indicated by the double-headed arrow 64. The stage 16 can also be tilted around its tilt axis 62 in the directions of the double-head arrow 66, and rotated in a plane, in the directions indicated by the double-headed arrow 68. Such a goniometer stage 16 is described in U.S. Pat. No. 3,702,399 for "Specimen Stage for an Elctron Microscope," and incorporated herein by reference.

In operation, the magnetic lenses of the electron microscope cause the magnified image 70 of the specimen 60 to appear rotated on the fluorescent screen 18. Hence, the direction of mechanical movement of the stage 16 is not necessarily coincident with or parallel to the movement of the image 70 on the screen 18. If the stage 16 is now moved in the direction (arrow 64) of the tilt axis 62, the movement of the image 70 on the screen 18 is observed. Thus, by moving the stage 16 back and forth, a good, though not absolute, notion of the location of the tilt axis on the magnified image 70 is obtained. By rotating the knob 54 to position the pins 36 and 38 so that their shadows 36a and 38a are aligned with the directions of the movement of the image 70, when the stage 16 is moved back and forth along the directions (arrow 64) of the tilt axis 62, the shadows 36a and 38a define a line 72 indicating the location of the tilt axis on the image 70, or an axis substantially closely parallel to it. The amount of rotation between the actual tilt axis 62 of the goniometer stage 16 relative to the position of the tilt axis (line 72) on the magnified specimen image 70 is indicated by the markings on the graduated cylindrical drum 56.

Thus, there has been described a tomographic marking device 10 wherein both the projected shadows 36a and 38a of the pins 36 and 38, respectively, and the magnified image 70 are simultaneously visible to the operator, and the relative positions of these images are independent of any film positioning within a camera (not shown, but disposed directly below the screen 18).

We claim:

1. In an electron microscope of the type wherein a specimen on a stage in adapted to be rotated about a tilt axis that is parallel to a viewing screen, for viewing a magnified image of said specimen, and said stage is moveable in the direction of said tilt axis, the improvement of a marking device for indicating on said magnified image the portion of said specimen on said tilt axis, said device comprising:
    a ring wheel,
    at least one pin fixed to said ring wheel and defining a straight line, substantially parallel to said screen, and passing through the center of said wheel,
    means to dispose said wheel between said specimen and said screen so that said line passes through said optical axis and a shadow of said pin projects on said screen, and
    means to rotate said wheel about said optical axis to align said shadow of said pin with the location of said tilt axis on said screen, the location of said tilt axis on said screen being determined by the direction of movement of said image when said stage is moved in the direction of said tilt axis.

2. In an electron microscope of the type described in claim 1:
    said means to rotate said wheel comprises means to indicate the amount of rotation of said tilt axis on said screen with reference to said tilt axis on said stage.

3. In an electron microscope of the type described in claim 1:
    said ring wheel has a pair of spaced-apart, colinearly disposed pins fixed to said wheel and defining a line substantially parallel to said screen and passing through said optical axis.

4. In an electron microscope of the type described in claim 3:
    said ring wheel is formed with gear teeth on its outer periphery, and
    said means to rotate said wheel comprises a gear meshed with said gear teeth and means coupled to said gear to rotate it, said latter means also including means to indicate the amount of rotation of said wheel with reference to said tilt axis on said stage.

5. In an electron microscope of the type described in claim 4:
    said wheel is disposed at a distance from said screen that causes only said pins to project a shadow adjacent the periphery of said screen and to be magnified a predetermined amount.

6. In an electron microscope of the type described in claim 1:
    said means to rotate said wheel comprises means to indicate the position of said tilt axis on said screen by aligning the shadow of said pin with the direction of movement of said image on said screem when said stage is moved in the direction of its tilt axis.

7. A tomographic marking device for use in an electron microscope between a specimen stage and a viewing screen of the microscope, said stage having a tilt axis and being moveable in the direction of the tilt axis, said device comprising:
    a ring wheel,
    at least one pin fixed to said wheel, extending inwardly, and defining a straight line that is a diameter of said wheel,
    support means to support said wheel for rotation thereon, said support means being formed with an opening substantially coincident with said ring wheel, and
    rotating means to rotate said wheel about its center, whereby to align said pin with the location of said tilt axis, the location of said tilt axis on said screen being determined by the direction of movement of an image on said screen when said stage is moved in the direction of said tilt axis.

8. A tomographic marking device as described in claim 7:
    wherein two spaced-apart, colinearly and diametrically disposed pins are fixed to, and extend from, the inner periphery of said wheel, and
    said rotation means comprises means to indicate the amount of rotation of said wheel.

* * * * *